United States Patent
Xu et al.

(10) Patent No.: US 12,444,643 B2
(45) Date of Patent: Oct. 14, 2025

(54) METHOD AND APPARATUS FOR POSITIONING OPTICAL ISOLATOR ASSEMBLY WITH REPLACEABLE MOTOR ASSEMBLY

(71) Applicant: KLA Corporation, Milpitas, CA (US)

(72) Inventors: Yaojun Xu, San Jose, CA (US); Rudy F. Garcia, Union City, CA (US)

(73) Assignee: KLA Corporation, Milpitas, CA (US)

( * ) Notice: Subject to any disclaimer, the term of this patent is extended or adjusted under 35 U.S.C. 154(b) by 352 days.

(21) Appl. No.: 17/938,875

(22) Filed: Oct. 7, 2022

(65) Prior Publication Data

US 2023/0122832 A1    Apr. 20, 2023

Related U.S. Application Data

(60) Provisional application No. 63/256,668, filed on Oct. 18, 2021.

(51) Int. Cl.
*H01L 21/687* (2006.01)
*B23K 3/08* (2006.01)

(52) U.S. Cl.
CPC .......... *H01L 21/68742* (2013.01); *B23K 3/08* (2013.01); *H01L 21/68785* (2013.01)

(58) Field of Classification Search
CPC ........ H01L 21/68742; H01L 21/68785; B23K 3/08; G01N 21/8806; G01N 21/9501; G01N 21/4738; G01N 2021/8822
See application file for complete search history.

(56) References Cited

U.S. PATENT DOCUMENTS

| | | | |
|---|---|---|---|
| 5,855,681 A * | 1/1999 | Maydan | H01L 21/67742 |
| | | | 204/298.25 |
| 6,441,884 B1 | 8/2002 | Takahashi et al. | |
| 10,983,443 B2 | 4/2021 | Krone et al. | |
| 11,927,621 B2 * | 3/2024 | Snow | H01L 21/68785 |
| 2017/0207384 A1 | 7/2017 | Tokuda et al. | |

(Continued)

FOREIGN PATENT DOCUMENTS

CN    105759392 A    7/2016
DE    102016210698 A1    12/2017

(Continued)

OTHER PUBLICATIONS

WIPO, International Search Report for International Application No. PCT/US2022/046345, Feb. 8, 2023.

(Continued)

*Primary Examiner* — Seahee Hong
(74) *Attorney, Agent, or Firm* — Hodgson Russ LLP (57) ABSTRACT

An apparatus includes a lifting device and a motor assembly. The lifting device is disposed in a lifting device housing and is configured to adjust a vertical position of an optical component connected to the lifting device. The motor assembly is disposed in a motor housing and is configured to drive the lifting device to adjust the vertical position of the optical component. The lifting device housing, the motor housing, and the optical component are disposed in an ultra-high vacuum chamber of an enclosure. In the case of motor failure, the motor housing can be disconnected from the lifting device housing, and the motor assembly can be decoupled from the lifting device, such that the motor assembly can be replaced.

12 Claims, 4 Drawing Sheets

(56) References Cited

U.S. PATENT DOCUMENTS

| | | | |
|---|---|---|---|
| 2018/0101105 A1 | 4/2018 | Freimann et al. | |
| 2018/0191958 A1 | 7/2018 | Kusunose | |
| 2021/0048756 A1 | 2/2021 | Marks et al. | |
| 2022/0262632 A1* | 8/2022 | Yahata | H01L 21/68742 |
| 2022/0316066 A1* | 10/2022 | Santiago | H01L 21/67011 |
| 2022/0319896 A1* | 10/2022 | Liang | H01L 21/68742 |

FOREIGN PATENT DOCUMENTS

| | | |
|---|---|---|
| KR | 101226219 B1 | 1/2013 |
| TW | 201003170 A | 1/2010 |

OTHER PUBLICATIONS

WIPO, Written Opinion of the International Searching Authority for International Application No. PCT/US2022/046345, Feb. 8, 2023.
TIPO, Office Action issued for ROC (Taiwan) Patent Application No. 111139370, Jun. 20, 2025, see X/Y/A references at p. 8.
EPO, Extended European Search Report issued for European Application No. 22884272.0, Jul. 4, 2025.

* cited by examiner

METHOD AND APPARATUS FOR POSITIONING OPTICAL ISOLATOR ASSEMBLY WITH REPLACEABLE MOTOR ASSEMBLY

CROSS-REFERENCE TO RELATED APPLICATIONS

This application claims priority to the provisional patent application filed Oct. 18, 2021 and assigned U.S. App. No. 63/256,668, the disclosure of which is hereby incorporated by reference.

FIELD OF THE DISCLOSURE

This disclosure relates to motor assemblies for operating a lifting device and, more particularly, for lifting optical components in an ultra-high vacuum environment.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Certain inspection processes are performed using an imaging mirror assembly (IMA) directed at a target on a stage in an ultra-high vacuum environment. The IMA is suspended by three isolators due to its high sensitivity to vibration. Each isolator is connected to a lifting device, where movement of each lifting device provides planar adjustment of the IMA. Each lifting device includes a precisely controlled motor to lift a heavy load in confined space. During operation, these motors may produce particles or hydrocarbon contaminants that can attach to other components in the vacuum chamber and decrease inspection accuracy.

While the motor assembly can be disposed outside the vacuum chamber at atmosphere, a dynamic vacuum feedthrough is required to couple the motor to the input rod of lifting device. The dynamic vacuum feedthrough devices and vacuum bellows can be expensive and occupy a great deal of valuable space in the inspection system and are difficult to integrate into existing systems. An alternative approach is to dispose a vacuum-compatible motor inside the lifting device enclosure itself. However, in the event of motor failure, the lifting device and connected optics would need to be disassembled to replace the affected motor in the assembly, leading to costly downtime. Furthermore, the IMA would need to be disconnected from all three lifting devices in the case of a single motor failure, as two lifting devices are not arranged to carry the imbalanced load.

Therefore, what is needed is a motor assembly for a lifting device that can be integrated with existing inspection systems, avoids contamination of the ultra-clean vacuum environment, and can be replaced with minimal impact on system operation.

BRIEF SUMMARY OF THE DISCLOSURE

An embodiment of the present disclosure provides an apparatus comprising a lifting device and a motor assembly. The lifting device may be disposed in a lifting device housing, and the lifting device may be configured to adjust a vertical position of an optical component at a first connection. The lifting device may be connected to the optical component by a vibration isolator. The lifting device may be disposed in a low vacuum chamber of the lifting device housing. The motor assembly may be disposed in a motor housing, and the motor assembly may be configured to drive the lifting device to adjust the vertical position of the optical component. The motor housing may be detachably connected to the lifting device housing, and the motor assembly may be detachably coupled to the lifting device. The lifting device housing, the motor housing, and the optical component may be disposed in an ultra-high vacuum chamber of an enclosure.

According to an embodiment of the present disclosure, the motor assembly may comprise a stepper motor and a gearhead. The gearhead may be driven by the stepper motor and coupled to an input drive shaft of the lifting device. The stepper motor may be configured to drive the input drive shaft via the gearhead to adjust the vertical position of the optical component. The gearhead may be coupled to the input drive shaft by a coupling.

According to an embodiment of the present disclosure, the coupling may comprise a first coupler, a second coupler, and a central disc. The first coupler may be connected to the gearhead, and the first coupler may comprise a first tongue extending in an axial direction. The second coupler may be connected to the input drive shaft, and the second coupler may comprise a second tongue extending in the axial direction. The central disc may be sandwiched between the first coupler and the second coupler. A first side of the central disc may comprise a first groove configured to receive the first tongue of the first coupler, and a second side of the central disc may comprise a second groove configured to receive the second tongue of the second coupler. The first groove and the second groove may be oriented 90 degrees relative to each other.

According to an embodiment of the present disclosure, the lifting device housing may comprise an input port. The gearhead may be coupled to the input drive shaft in the input port. The input port may be centrally disposed in a cylindrical protrusion of the lifting device housing, and the motor device housing may surround the cylindrical protrusion when connected to the lifting device housing. A vacuum seal may be disposed between the lifting device housing and the motor housing, in a sealing groove of the lifting device housing.

According to an embodiment of the present disclosure, the enclosure may comprise an access panel. The motor housing and motor assembly may be removable from the ultra-high vacuum chamber via the access panel.

According to an embodiment of the present disclosure, the lifting device may be a first lifting device, and the apparatus may further comprise a second lifting device and a third lifting device. The second lifting device may be disposed in a second lifting device housing, and the third lifting device disposed in a third lifting device housing. The second lifting device and the third lifting device may be configured to adjust the vertical position of the optical component at a second connection and a third connection, respectively. The second lifting device may be connected to the optical component by a second vibration isolator, and the third lifting device may be connected to the optical component by a third vibration isolator. The apparatus may further comprise a second motor assembly and a third motor assembly. The second motor assembly may be disposed in a second motor housing, and the third motor assembly may be disposed in a third motor housing. The second motor assembly may be configured to drive the second lifting device to adjust the vertical position of the optical component, and the third motor assembly may be configured to drive the third lifting device to adjust the vertical position of the optical component. The second motor housing may be detachably connected to the second lifting device housing, and the third motor housing may be detachably connected to the third lifting device housing. The second motor assembly may be detachably coupled to the second lifting device, and the third motor assembly may be detachably coupled to the third lifting device.

According to an embodiment of the present disclosure, the first lifting device, the second lifting device, and the third lifting device may be configured to adjust a planar orientation of the optical component by adjusting the vertical position of the optical component at least one of the first connection, the second connection, or the third connection.

According to an embodiment of the present disclosure, the second lifting device housing, the third lifting device housing, the second motor housing, and the third motor housing may be disposed in an ultra-high vacuum chamber of an enclosure. The enclosure may comprise a second access panel and a third access panel. The second motor housing and second motor assembly may be removable from the ultra-high vacuum chamber via the second access panel, and the third motor housing and third motor assembly may be removable from the ultra-high vacuum chamber via the third access panel.

Another embodiment of the present disclosure provides a method. The method may comprise: coupling a motor assembly to a lifting device, the lifting device being disposed in a lifting device housing; connecting a motor housing to the lifting device housing, the motor assembly being disposed in the motor housing; pumping, via a vacuum pump, a vacuum chamber to an ultra-high vacuum pressure, the motor housing and the lifting device housing being disposed in the vacuum chamber; and driving, via the motor assembly, the lifting device to adjust a vertical position of an optical component connected to the lifting device in the vacuum chamber.

According to an embodiment of the present disclosure, the method may further comprise: venting the vacuum chamber to an atmospheric pressure; disconnecting the motor housing from the lifting device housing; and uncoupling the motor assembly from the lifting device.

According to an embodiment of the present disclosure, the method may further comprise: coupling a replacement motor assembly to the lifting device; re-connecting the motor housing to the lifting device housing; and pumping, via the vacuum pump, the vacuum chamber to the ultra-high vacuum pressure.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

Figure 1:
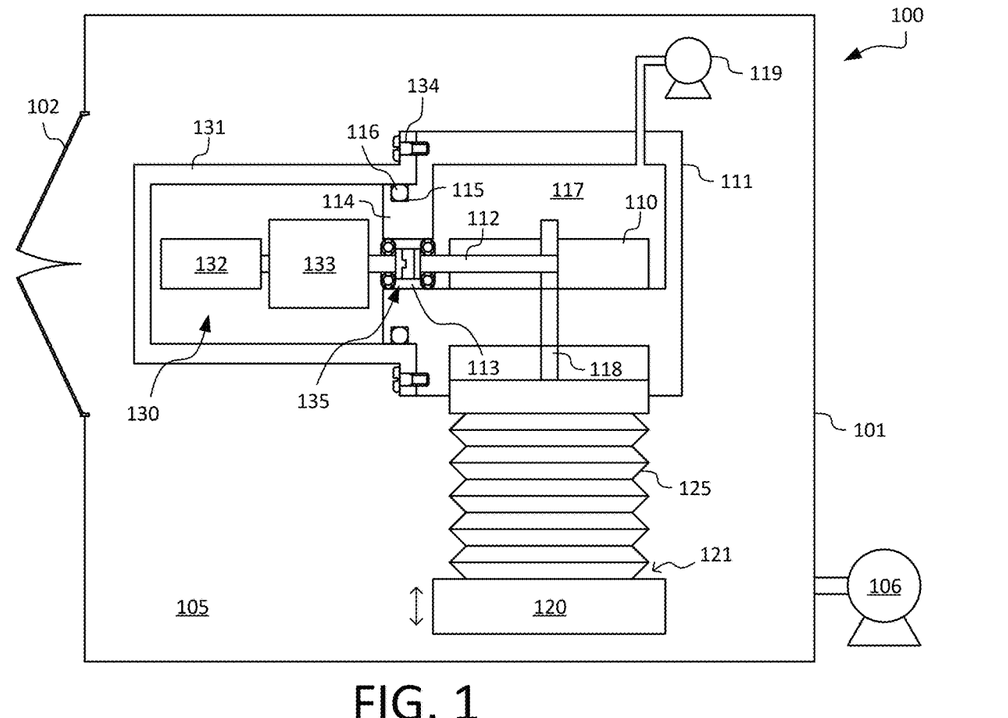
FIG. 1 is a sectional side view of an apparatus according to an embodiment of the present disclosure.

An embodiment of the present disclosure provides an apparatus 100 shown in FIG. 1. The apparatus 100 may comprise a lifting device 110. The lifting device 110 may be configured to adjust a vertical position of an optical component 120 at a first connection 121. The lifting device 110 may comprise an input drive shaft 112 and a driven member 118. Rotation of the input drive shaft 112 may cause corresponding linear movement of the driven member 118. For example, the input drive shaft 112 and the driven member 118 may have a rack and pinion design or another arrangement configured to convert rotational motion to linear motion. The driven member 118 may be connected to the optical component 120 at the first connection 121. Thus, the linear movement of the driven member 118 caused by rotation of the input drive shaft 112 may adjust the vertical position of the optical component 120 at the first connection 121. The lifting device 110 may be connected to the optical component 120 by a vibration isolator 125. The vibration isolator 125 may be a compliant component, such as a spring or bellows, that allows the optical component 120 to hang from the lifting device 110 and may prevent vibrations in the system from affecting the alignment of the optical component 120. The optical component 120 may be an imaging mirror assembly (IMA) or other inspection or metrology tool.

The apparatus 100 may further comprise a motor assembly 130. The motor assembly 130 may be configured to drive the lifting device 110 to adjust the vertical position of the optical component 120. The motor assembly 130 may comprise a stepper motor 132 and a gearhead 133. The gearhead 133 may be driven by the stepper motor 132 and coupled to the input drive shaft 112 of the lifting device 110. The stepper motor 132 may be configured to drive the input drive shaft 112 via the gearhead 133 to adjust the vertical position of the optical component 120.

Figure 2A:
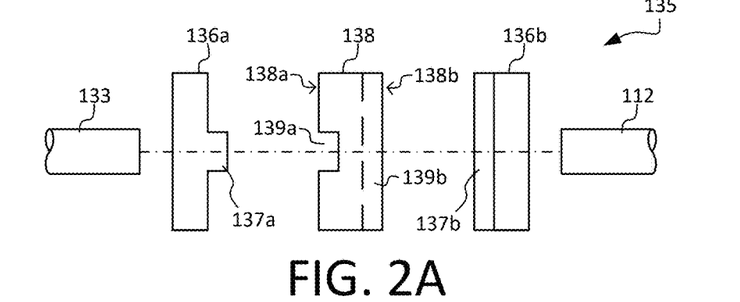
FIG. 2A is an exploded view of a coupling according to an embodiment of the present disclosure.
Figure 2B:
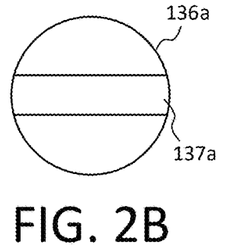
FIG. 2B is an end view of a first coupler of the coupling of FIG. 2A.
Figure 2C:
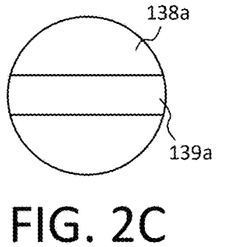
FIG. 2C is a first side view of a central disc of the coupling of FIG. 2A.
Figure 2D:
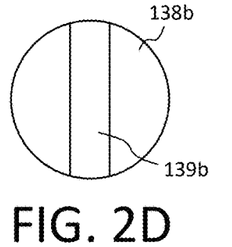
FIG. 2D is a second side view of the central disc of the coupling of FIG. 2A.
Figure 2E:
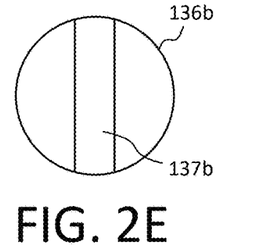
FIG. 2E is an end view of a second coupler of the coupling of FIG. 2A.

The motor assembly 130 may be detachably coupled to the lifting device 110. For example, the gearhead 133 may be coupled to the input drive shaft 112 by a coupling 135. The coupling 135 may be an Oldham coupling or other type of coupling. As shown in FIG. 2A, the coupling 135 may comprise a first coupler 136a connected to the gearhead 133. The first coupler 136a may comprise a first tongue 137a extending in an axial direction. The coupling 135 may further comprise a second coupler 136b connected to the input drive shaft 112. The second coupler 136b may comprise a second tongue 137b extending in the axial direction. The coupling 135 may further comprise a central disc 138 sandwiched between the first coupler 136a and the second coupler 136b. A first side 138a of the central disc 138 may comprise a first groove 139a configured to receive the first tongue 137a of the first coupler 136a, and a second side 138b of the central disc 138 may comprise a second groove 139b configured to receive the second tongue 137b of the second coupler 136b. The first groove 139a and the second groove 139b may be oriented 90 degrees relative to each other, as shown in FIGS. 2C and 2D. The first coupler 136a and the second coupler 136b may also have identical structure, but are oriented 90 degrees relative to each other, as shown in FIGS. 2B and 2E. The coupling 135 may allow the motor assembly 130 to be easily coupled and de-coupled from the lifting device 110 with tongue-and-groove connections.

The required torque of the lifting device 110 may depend on the weight of the optical component 120 and the corresponding force required to lift the optical component 120. The stepper motor 132 and the gearhead 133 may be selected to provide the required torque to the input drive shaft 112 of the lifting device 110. For example, the stepper motor 132 may have a torque that is increased by a gear ratio of the gearhead 133 to provide the required torque to the input drive shaft 112 to lift the optical component 120. By minimizing the torque of the stepper motor 132, the size of the stepper motor 132 may be reduced, thereby reducing the size required for the motor housing 131. The selected stepper motor 132 and gearhead 133 may be ultra-high vacuum (UHV) compatible.

The lifting device 110 and the motor assembly 130 may be disposed in separate housings. For example, as shown in FIG. 1, the lifting device 110 may be disposed in a lifting device housing 111, and the motor assembly 130 may be disposed in a motor housing 131. The lifting device housing 111 may have a substantially rectangular shape, and the motor housing 131 may have a substantially cylindrical shape. The shapes and sizes of the lifting device housing 111 and the motor housing 131 may depend on the geometries of the lifting device 110 and the motor assembly 130, respectively, and the available space within the enclosure 101. The motor housing 131 may be detachably connected to the lifting device housing 111. For example, the motor housing 131 may be detachably connected to one side of the lifting device housing 111 by one or more fasteners 134. The one or more fasteners 134 may be received by corresponding holes in a circumferential flange of the motor housing 131 and corresponding holes in one side of the lifting device housing 111. Other ways of detachably connecting the motor housing 131 and the lifting device housing 111 are within the scope of the present disclosure.

The lifting device housing 111, the motor housing 131, and the optical component 120 may be disposed in an ultra-high vacuum chamber 105 of an enclosure 101. A vacuum pump 106 may be configured to control the ultra-high vacuum chamber 105 to low or vacuum pressures. The vacuum pressure may be less than $10^{-7}$ mbar. For example, the vacuum pressure may be ultra-high vacuum (UHV) levels (e.g., between $10^{-7}$ and $10^{-12}$ mbar).

The lifting device housing 111 may comprise an input port 113. The gearhead 133 may be coupled to the input drive shaft 112 in the input port 113. One or more bearings may be provided in the input port 113 to position the gearhead 133 and the input drive shaft 112 for coupling. The input port 113 may be centrally disposed in a cylindrical protrusion 114 of the lifting device housing 111. The motor housing 131 may surround the cylindrical protrusion 114 when connected to the lifting device housing 111. Electrical wires connected to the stepper motor 132 may be routed through the input port 113 into the lifting device housing 111 for connection with electrical feedthroughs.

The lifting device housing 111 may further comprise a sealing groove 115. The sealing groove 115 may be disposed on a circumferential surface of the cylindrical protrusion 114. A vacuum seal 116 may be disposed between the lifting device housing 111 and the motor housing 131 in the sealing groove 115. The vacuum seal 116 may seal the ultra-high vacuum chamber 105 from the interior of the connected lifting device housing 111 and motor housing 131. Thus, contaminants generated by the motor assembly 130 during operation may be prevented from entering the clean ultra-high vacuum chamber 105.

The lifting device housing 111 may further comprise a low vacuum chamber 117. The low vacuum chamber 117 may be pumped to low or vacuum pressures by a low vacuum pump 119. The lifting device 110 may be disposed in the low vacuum chamber 117. When the motor housing 131 is connected to the lifting device housing 111, the interior of the motor housing 131 may be in communication with the low vacuum chamber 117 via the input port 113. Thus, the motor assembly 130 may operate under low or vacuum pressure.

The enclosure 101 may comprise an access panel 102. The access panel 102 may be a door or removable panel that can provide access to the interior of the enclosure 101, e.g., the ultra-high vacuum chamber 105. When closed, the access panel 102 may seal the ultra-high vacuum chamber 105. The motor housing 131 and motor assembly 130 may be removable from the ultra-high vacuum chamber 105 via the access panel 102. For example, the access panel 102 may be aligned with the motor housing 131, such that the motor housing 131 and the motor assembly 130 may be removed from the ultra-high vacuum chamber 105 in a straight line through the access panel 102. The access panel 102 may also be proximal to the motor housing 131, so as to reduce the distance required to reach into the ultra-high vacuum chamber 105 to remove the motor housing 131 and the motor assembly 130.

With the apparatus 100 of the present disclosure, the motor assembly 130 may be packaged in a motor housing 131, separate from the lifting device 110 and lifting device housing 111, that can prevent contamination of the ultra-high vacuum chamber 105. In addition, the motor assembly 130 may be easily removed and replaced in the case of motor failure, without moving the lifting device 110 or optical component 120. Thus, the apparatus 100 may be easily integrated in existing inspection systems and may be maintained with minimal impact on the system.

Figure 3:
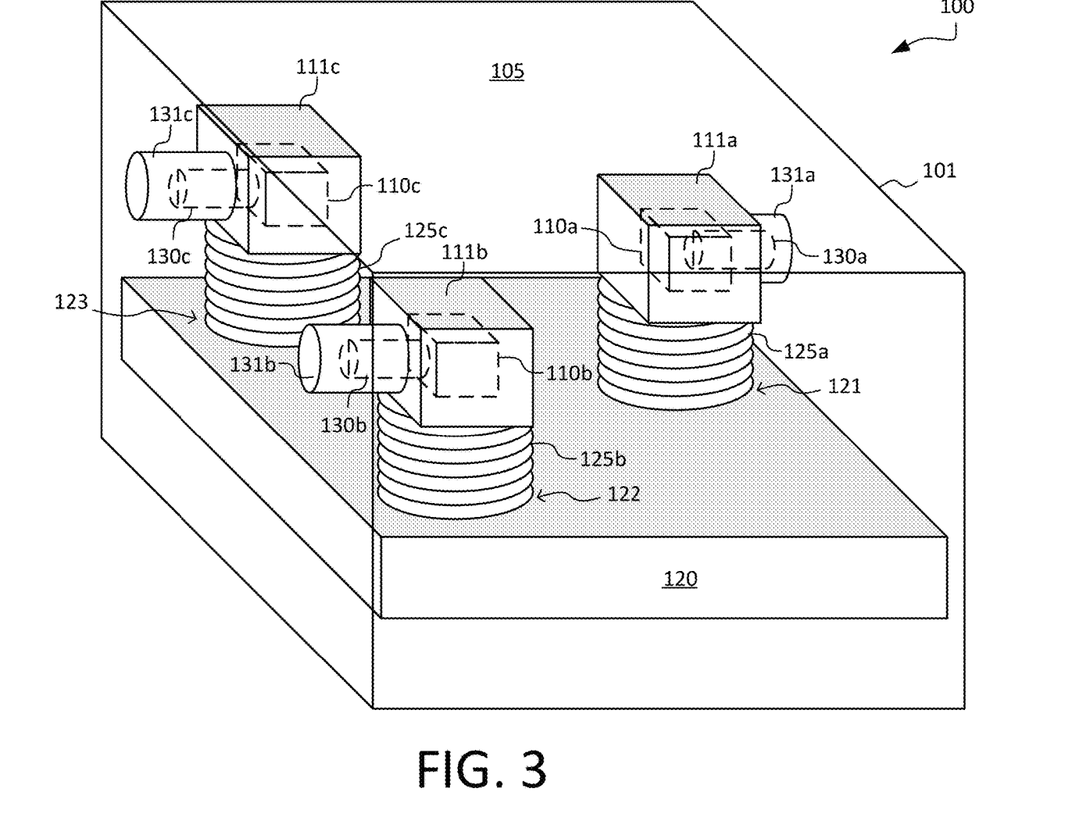
FIG. 3 is a perspective view of an apparatus according to another embodiment of the present disclosure.

According to an embodiment of the present disclosure, the apparatus 100 may comprise three lifting devices 110. As shown in FIG. 3, the three lifting devices 110 may comprise a first lifting device 110a, a second lifting device 110b, and a third lifting device 110c. The first lifting device 110a may be disposed in a first lifting device housing 111a, the second lifting device 110b may be disposed in a second lifting device housing 111b, and the third lifting device 110c may be disposed in a third lifting device housing 111c. The first lifting device 110a, the second lifting device 110b, and the third lifting device 110c may be configured to adjust the vertical position of the optical component 120 at a first connection 121, a second connection 122, and a third connection 123, respectively. The first connection 121, the second connection 122, and the third connection 123 may be three non-collinear points on a top surface of the optical component 120. The locations of the first connection 121, the second connection 122, and the third connection 123 may depend on the geometry of the optical component 120 and/or the space available within the enclosure 101. The optical component 120 may be an imaging mirror assembly (IMA) or other inspection or metrology tool. Each of the first lifting device 110a, second lifting device 110b, and third lifting device 110c may be connected to the optical component by a respective vibration isolator 125. For example, the first lifting device 110a may be connected to the optical component by a first vibration isolator 125a, the second lifting device 110b may be connected to the optical component 120 by a second vibration isolator 125b, and the third lifting device 110c may be connected to the optical component 120 by a third vibration isolator 125c. The first vibration isolator 125a, second vibration isolator 125b, and third vibration isolator 125c may allow the optical component 120 to hang from the first lifting device 110a, second lifting device 110b, and third lifting device 110c, and may prevent vibrations in the system from affecting the alignment of the optical component 120.

Each of the three lifting devices 110 may be coupled to a corresponding motor assembly 130 disposed in a separate motor housing 131. For example, a first motor assembly 130a may be disposed in a first motor housing 131a, a second motor assembly 130b may be disposed in a second motor housing 131b, and a third motor assembly 130c may be disposed in a third motor housing 131c. The first motor assembly 130a, the second motor assembly 130b, and the third motor assembly 130c may be configured to drive the first lifting device 110a, the second lifting device 110b, and third lifting device 110c, respectively, to adjust the vertical position of the optical component 120. For example, the first lifting device 110a, the second lifting device 110b, and the third lifting device 110c may be configured to adjust a planar orientation of the optical component 120 by adjusting the vertical position of the optical component 120 at least one of the first connection 121, the second connection 122, or the third connection 123 by driving a corresponding one of the first motor assembly 130a, the second motor assembly 130b, and the third motor assembly 130c. Each of the first motor assembly 130a, second motor assembly 130b, and third motor assembly 130c may comprise the components of the motor assembly 130 described above.

The first motor assembly 130a may be detachably coupled to the first lifting device 110a, the second motor assembly 130b may be detachably coupled to the second lifting device 110b, and the third motor assembly 130c may be detachably coupled to the third lifting device 110c. For example, each of the first motor assembly 130a, second motor assembly 130b, and third motor assembly 130c may be detachably coupled to the first lifting device 110a, second lifting device 110b, and third lifting device 110c by respective couplings 135 described above.

The first motor housing 131a may be detachably connected to the first lifting device housing 111a, the second motor housing 131b may be detachably connected to the second lifting device housing 111b, and the third motor housing 131c may be detachably connected to the third lifting device housing 111c. Each of the motor housings 131 may be detachably connected to the respective lifting device housing 111 by one or more fasteners 134 or other means.

Figure 4:
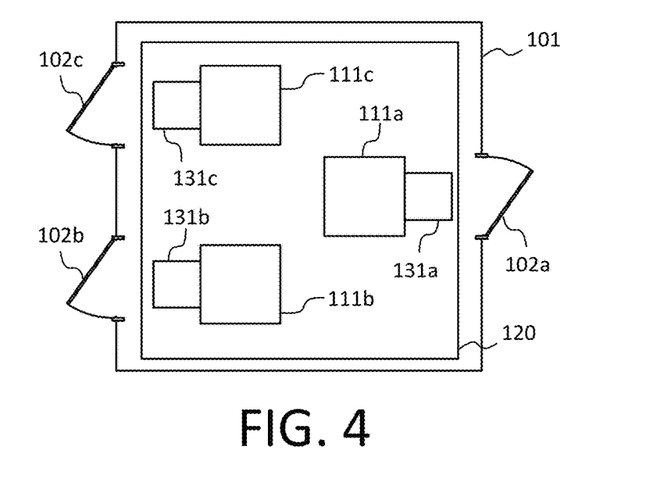
FIG. 4 is a top view of the apparatus of FIG. 3.

The first lifting device housing 111a, the second lifting device housing 111b, the third lifting device housing 111c, the first motor housing 131a, the second motor housing 131b, the third motor housing 131c, and the optical component 120 may be disposed in the ultra-high vacuum chamber 105 of the enclosure 101. The enclosure 101 may comprise at least one access panel 102 to remove the respective motor housings 131 and motor assemblies 130 from the ultra-high vacuum chamber 105. For example, as shown in FIG. 4, the first motor housing 131a and the first motor assembly 130a may be removable from the ultra-high vacuum chamber 105 via a first access panel 102a, the second motor housing 131b and the second motor assembly 130b may be removable from the ultra-high vacuum chamber 105 via a second access panel 102b, and the third motor housing 131c and the third motor assembly 130c may be removable from the ultra-high vacuum chamber 105 via a third access panel 102c. More than one of the motor housing 131 and motor assemblies 130 may be removable from the ultra-high vacuum chamber 105 via the same access panel 102.

With the apparatus 100 of the present disclosure having three lifting devices 110, each of the first motor assembly 130a, second motor assembly 130b, and third motor assembly 130c may be separately contained in respective motor housings 131 to prevent contamination of the ultra-high vacuum chamber 105. In the case of motor failure, each of the first motor assembly 130a, second motor assembly 130b, and third motor assembly 130c may be separately removed and replaced without moving any of the lifting devices 110 or the optical component 120. Thus, the apparatus 100 may be easily integrated in existing inspection systems and may be maintained with minimal impact on the system.

Figure 5:
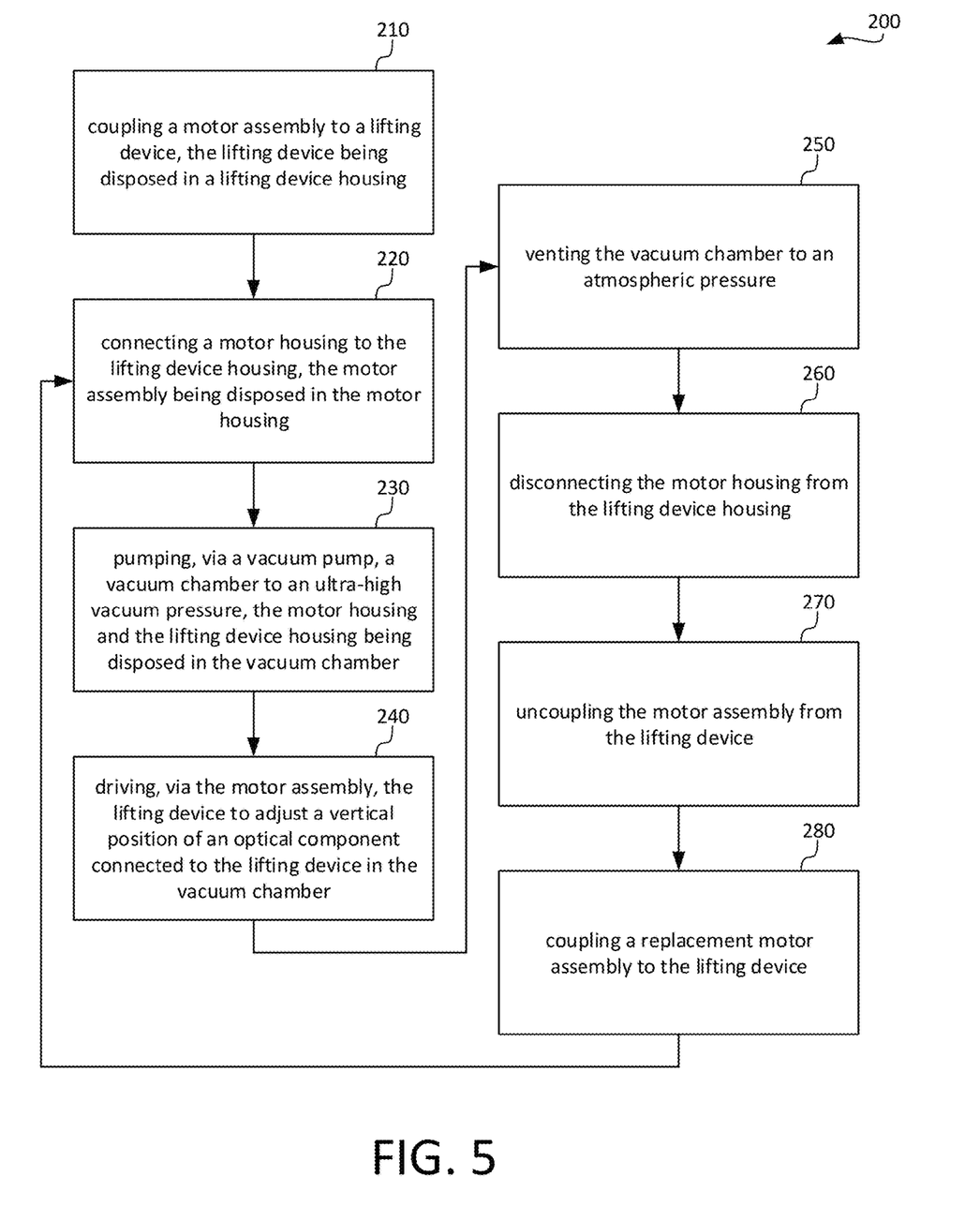
FIG. 5 is a flowchart of a method according to an embodiment of the present disclosure.

An embodiment of the present disclosure provides a method 200. As shown in FIG. 5, the method 200 may comprise the following steps.

At step 210, a motor assembly is coupled to a lifting device. The lifting device may be disposed in a lifting device housing and connected to an optical component. The lifting device may comprise an input drive shaft and a driven member connected to the optical component, where rotation of the input drive shaft causes corresponding linear movement of the driven member and the optical component. The motor assembly may comprise a stepper motor and a gearhead, which may be detachably coupled to the input drive shaft by a coupling. The stepper motor may be configured to drive the input drive shaft via the gearhead.

At step 220, a motor housing is connected to the lifting device housing. The motor assembly may be disposed in the motor housing. The motor housing may be connected to the lifting device housing by one or more fasteners or other manners of connection.

At step 230, a vacuum pump pumps a vacuum chamber to an ultra-high vacuum pressure. The motor housing and the lifting device housing may be disposed in the vacuum chamber. The vacuum pump may be configured to control the ultra-high vacuum chamber to low or vacuum pressures. The vacuum pressure may be less than $10^{-7}$ mbar. For example, the vacuum pressure may be ultra-high vacuum (UHV) levels (e.g., between $10^{-7}$ and $10^{-12}$ mbar).

At step 240, the motor assembly drives the lifting device to adjust a vertical position of an optical component connected to the lifting device in the vacuum chamber. For example, the stepper motor may drive the input drive shaft, via the gearhead to cause corresponding linear movement of the driven member and the optical component. The stepper motor and gearhead may be selected to provide the required torque to lift the optical component and to provide fine incremental adjustment of the vertical position of the optical component.

With the method 200, the motor assembly may be contained within a separate motor housing during operation, such that contaminants may be prevented from entering the clean ultra-high vacuum chamber and can be easily integrated into existing inspection systems.

In the case of motor failure, the motor assembly may need to be replaced. According to an embodiment of the present disclosure, the method 200 may further comprise the following steps to facilitate motor replacement.

At step 250, the vacuum chamber is vented to an atmospheric pressure. The vacuum chamber may be vented by turning off the vacuum pump and/or by opening a vent to the vacuum chamber.

At step 260, the motor housing is disconnected from the lifting device housing. For example, the one or more fasteners may be removed from the motor housing such that it can be disconnected from the lifting device housing.

At step 270, the motor assembly is uncoupled from the lifting device. For example, the coupling may be separated such that the gearhead is uncoupled from the input drive shaft. Electrical wires connected to the stepper motor may also be disconnected to uncouple the motor assembly from the lifting device.

At step 280, a replacement motor assembly is coupled to the lifting device. The replacement motor assembly may contain the same components as the failed motor assembly, such that the gearhead of the replacement motor assembly can be coupled to the input drive shaft by the same coupling. The electrical wires may be reconnected to the stepper motor to power the replacement motor assembly.

After step 280, steps 220 to 240 may be repeated with the replacement motor assembly. Namely, the motor housing may be reconnected to the lifting device housing, the vacuum pump may pump the vacuum chamber to the ultra-high vacuum pressure, and the replacement motor assembly may drive the lifting device to adjust the vertical position of the optical component connected to the lifting device in the vacuum chamber. The method 200 may therefore allow replacement of the motor assembly without moving the lifting device or optical component, and maintenance can have minimal impact on the system.

Figure 6:
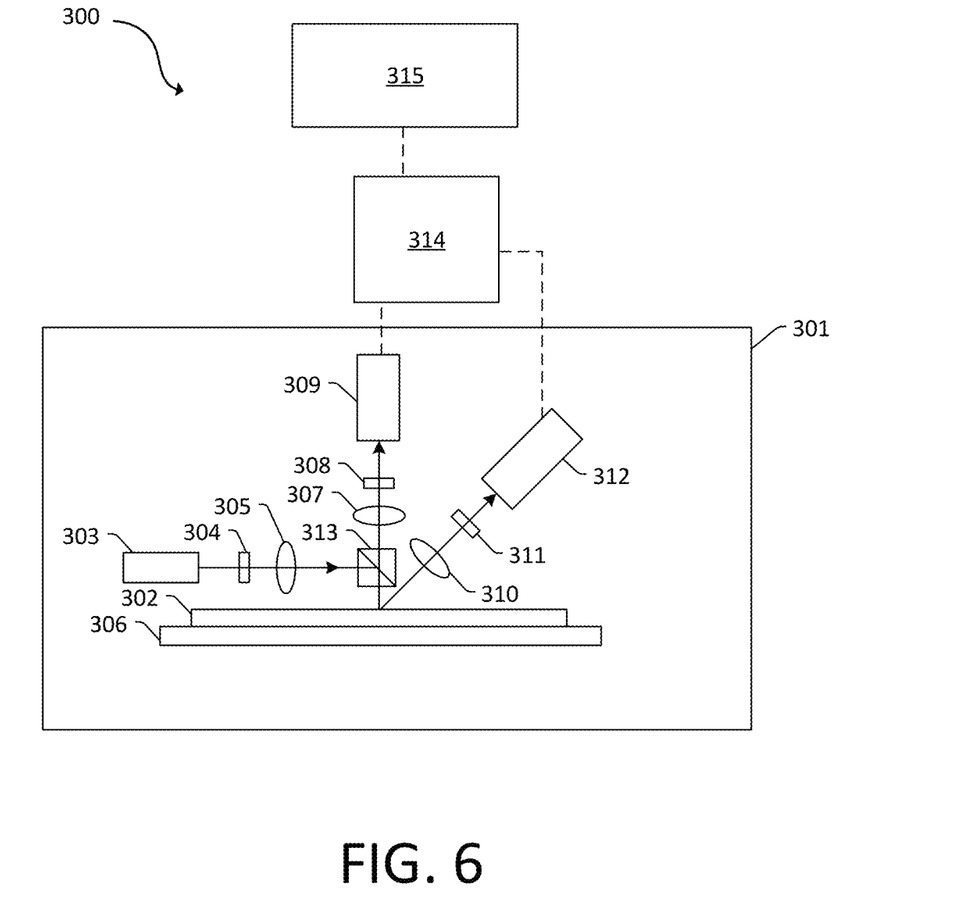
FIG. 6 is a schematic of a system according to an embodiment of the present disclosure.

Another embodiment of the present disclosure provides a system 300 shown in FIG. 6. The system 300 includes optical based subsystem 301. In general, the optical based subsystem 301 is configured for generating optical based output for a specimen 302 by directing light to (or scanning light over) and detecting light from the specimen 302. In one embodiment, the specimen 302 includes a wafer. The wafer may include any wafer known in the art. In another embodiment, the specimen 302 includes a reticle. The reticle may include any reticle known in the art.

In the embodiment of the system 300 shown in FIG. 6, optical based subsystem 301 includes an illumination subsystem configured to direct light to specimen 302. The illumination subsystem includes at least one light source. For example, as shown in FIG. 6, the illumination subsystem includes light source 303. In one embodiment, the illumination subsystem is configured to direct the light to the specimen 302 at one or more angles of incidence, which may include one or more oblique angles and/or one or more normal angles. For example, as shown in FIG. 6, light from light source 303 is directed through optical element 304 and then lens 305 to specimen 302 at an oblique angle of incidence. The oblique angle of incidence may include any suitable oblique angle of incidence, which may vary depending on, for instance, characteristics of the specimen 302.

The optical based subsystem 301 may be configured to direct the light to the specimen 302 at different angles of incidence at different times. For example, the optical based subsystem 301 may be configured to alter one or more characteristics of one or more elements of the illumination subsystem such that the light can be directed to the specimen 302 at an angle of incidence that is different than that shown in FIG. 6. In one such example, the optical based subsystem 301 may be configured to move light source 303, optical element 304, and lens 305 such that the light is directed to the specimen 302 at a different oblique angle of incidence or a normal (or near normal) angle of incidence.

In some instances, the optical based subsystem 301 may be configured to direct light to the specimen 302 at more than one angle of incidence at the same time. For example, the illumination subsystem may include more than one illumination channel, one of the illumination channels may include light source 303, optical element 304, and lens 305 as shown in FIG. 6 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 302 at different angles of incidence may be different such that light resulting from illumination of the specimen 302 at the different angles of incidence can be discriminated from each other at the detector(s).

In another instance, the illumination subsystem may include only one light source (e.g., light source 303 shown in FIG. 6) and light from the light source may be separated into different optical paths (e.g., based on wavelength, polarization, etc.) by one or more optical elements (not shown) of the illumination subsystem. Light in each of the different optical paths may then be directed to the specimen 302. Multiple illumination channels may be configured to direct light to the specimen 302 at the same time or at different times (e.g., when different illumination channels are used to sequentially illuminate the specimen). In another instance, the same illumination channel may be configured to direct light to the specimen 302 with different characteristics at different times. For example, in some instances, optical element 304 may be configured as a spectral filter and the properties of the spectral filter can be changed in a variety of different ways (e.g., by swapping out the spectral filter) such that different wavelengths of light can be directed to the specimen 302 at different times. The illumination subsystem may have any other suitable configuration known in the art for directing the light having different or the same characteristics to the specimen 302 at different or the same angles of incidence sequentially or simultaneously.

In one embodiment, light source 303 may include a broadband plasma (BBP) source. In this manner, the light generated by the light source 303 and directed to the specimen 302 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 303 may also include a polychromatic light source that generates light at multiple discrete wavelengths or wavebands.

Light from optical element 304 may be focused onto specimen 302 by lens 305. Although lens 305 is shown in FIG. 6 as a single refractive optical element, it is to be understood that, in practice, lens 305 may include a number of refractive and/or reflective optical elements that in combination focus the light from the optical element to the specimen. The illumination subsystem shown in FIG. 6 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 313), aperture(s), and the like, which may include any such suitable optical elements known in the art. In addition, the optical based subsystem 301 may be configured to alter one or more of the elements of the illumination subsystem based on the type of illumination to be used for generating the optical based output.

The optical based subsystem 301 may also include a scanning subsystem configured to cause the light to be scanned over the specimen 302. For example, the optical based subsystem 301 may include stage 306 on which specimen 302 is disposed during optical based output generation. The scanning subsystem may include any suitable mechanical and/or robotic assembly (that includes stage 306) that can be configured to move the specimen 302 such that the light can be scanned over the specimen 302. In addition, or alternatively, the optical based subsystem 301 may be configured such that one or more optical elements of the optical based subsystem 301 perform some scanning of the light over the specimen 302. The light may be scanned over the specimen 302 in any suitable fashion such as in a serpentine-like path or in a spiral path.

The optical based subsystem 301 further includes one or more detection channels. At least one of the one or more detection channels includes a detector configured to detect light from the specimen 302 due to illumination of the specimen 302 by the subsystem and to generate output responsive to the detected light. For example, the optical based subsystem 301 shown in FIG. 6 includes two detection channels, one formed by collector 307, element 308, and detector 309 and another formed by collector 310, element 311, and detector 312. As shown in FIG. 6, the two detection channels are configured to collect and detect light at different angles of collection. In some instances, both detection channels are configured to detect scattered light, and the detection channels are configured to detect light that is scattered at different angles from the specimen 302. However, one or more of the detection channels may be configured to detect another type of light from the specimen 302 (e.g., reflected light).

As further shown in FIG. 6, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 310, element 311, and detector 312 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 6 shows an embodiment of the optical based subsystem 301 that includes two detection channels, the optical based subsystem 301 may include a different number of detection channels (e.g., only one detection channel or two or more detection channels). In one such instance, the detection channel formed by collector 310, element 311, and detector 312 may form one side channel as described above, and the optical based subsystem 301 may include an additional detection channel (not shown) formed as another side channel that is positioned on the opposite side of the plane of incidence. Therefore, the optical based subsystem 301 may include the detection channel that includes collector 307, element 308, and detector 309 and that is centered in the plane of incidence and configured to collect and detect light at scattering angle(s) that are at or close to normal to the specimen 302 surface. This detection channel may therefore be commonly referred to as a "top" channel, and the optical based subsystem 301 may also include two or more side channels configured as described above. As such, the optical based subsystem 301 may include at least three channels (i.e., one top channel and two side channels), and each of the at least three channels has its own collector, each of which is configured to collect light at different scattering angles than each of the other collectors.

The detector 309 and/or detector 312 may correspond to the optical component 120 of the apparatus 100 described above. For example, the detector 309 and/or the detector 312 may be connected to at least one lifting device 110 configured to adjust a vertical position of the detector 309 and/or the detector 312, and the detector 309 and/or the detector 312 may hang from the at least one lifting device 110 by a vibration isolator 125 to prevent vibrations in the system 300 from affecting the detector 309 and/or the detector 312.

As described further above, each of the detection channels included in the optical based subsystem 301 may be configured to detect scattered light. Therefore, the optical based subsystem 301 shown in FIG. 6 may be configured for dark field (DF) output generation for specimens 302. However, the optical based subsystem 301 may also or alternatively include detection channel(s) that are configured for bright field (BF) output generation for specimens 302. In other words, the optical based subsystem 301 may include at least one detection channel that is configured to detect light specularly reflected from the specimen 302. Therefore, the optical based subsystems 301 described herein may be configured for only DF, only BF, or both DF and BF imaging. Although each of the collectors are shown in FIG. 6 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 314 may be configured to generate images of the specimen 302 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 6 is provided herein to generally illustrate a configuration of an optical based subsystem 301 that may be included in the system embodiments described herein or that may generate optical based output that is used by the system embodiments described herein. The optical based subsystem 301 configuration described herein may be altered to optimize the performance of the optical based subsystem 301 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 314 may be coupled to the components of the system 300 in any suitable manner (e.g., via one or more transmission media, which may include wired and/or wireless transmission media) such that the processor 314 can receive output. The processor 314 may be configured to perform a number of functions using the output. The system 300 can receive instructions or other information from the processor 314. The processor 314 and/or the electronic data storage unit 315 optionally may be in electronic communication with a wafer inspection tool, a wafer metrology tool, or a wafer review tool (not illustrated) to receive additional information or send instructions. For example, the processor 314 and/or the electronic data storage unit 315 can be in electronic communication with a scanning electron microscope.

The processor 314, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 314 and electronic data storage unit 315 may be disposed in or otherwise part of the system 300 or another device. In an example, the processor 314 and electronic data storage unit 315 may be part of a standalone control unit or in a centralized quality control unit. Multiple processors 314 or electronic data storage units 315 may be used.

The processor 314 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 314 to implement various methods and functions may be stored in readable storage media, such as a memory in the electronic data storage unit 315 or other memory.

If the system 300 includes more than one processor 314, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 314 may be configured to perform a number of functions using the output of the system 300 or other output. For instance, the processor 314 may be configured to send the output to an electronic data storage unit 315 or another storage medium. The processor 314 may be configured according to any of the embodiments described herein. The processor 314 also may be configured to perform other functions or additional steps using the output of the system 300 or using images or data from other sources.

The processor 314 may be configured to control the apparatus 100. For example, the processor 314 may control at least one motor assembly 130 to drive the corresponding lifting device 110 to adjust the vertical position of the optical component 120.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 314 or, alternatively, multiple processors 314. Moreover, different subsystems of the system 300 may include one or more computing or logic systems. Therefore, the above description should not be interpreted as a limitation on the present disclosure but merely an illustration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
 an optical component;
 an ultra-high vacuum chamber of an enclosure;
 a lifting device disposed in a lifting device housing, the lifting device being configured to adjust a vertical position of the optical component at a first connection; and
 a motor assembly disposed in a motor housing, the motor assembly being configured to drive the lifting device to adjust the vertical position of the optical component;
 wherein the motor housing is detachably connected to the lifting device housing, the motor assembly is detachably coupled to the lifting device, and the lifting device housing, the motor housing, and the optical component are disposed in the ultra-high vacuum chamber of the enclosure.

2. The apparatus of claim 1, wherein the motor assembly comprises:
 a stepper motor; and
 a gearhead driven by the stepper motor and coupled to an input drive shaft of the lifting device;
 wherein the stepper motor is configured to drive the input drive shaft via the gearhead to adjust the vertical position of the optical component.

3. The apparatus of claim 2, wherein the gearhead is coupled to the input drive shaft by a coupling.

4. The apparatus of claim 3, wherein the coupling comprises:
 a first coupler connected to the gearhead, the first coupler comprising a first tongue extending in an axial direction;
 a second coupler connected to the input drive shaft, the second coupler comprising a second tongue extending in the axial direction; and
 a central disc sandwiched between the first coupler and the second coupler, wherein a first side of the central disc comprises a first groove configured to receive the first tongue of the first coupler, and a second side of the central disc comprises a second groove configured to receive the second tongue of the second coupler.

5. The apparatus of claim 4, wherein the first groove and the second groove are oriented 90 degrees relative to each other.

6. The apparatus of claim 2, wherein the lifting device housing comprises an input port, the gearhead being coupled to the input drive shaft in the input port.

7. The apparatus of claim 6, wherein the input port is centrally disposed in a cylindrical protrusion of the lifting device housing, and the motor housing surrounds the cylindrical protrusion when connected to the lifting device housing.

8. The apparatus of claim 1, further comprising a vacuum seal disposed between the lifting device housing and the motor housing.

9. The apparatus of claim 8, wherein the vacuum seal is disposed in a sealing groove of the lifting device housing.

10. The apparatus of claim 1, wherein the lifting device is disposed in a low vacuum chamber of the lifting device housing.

11. The apparatus of claim 1, wherein the enclosure comprises an access panel, and the motor housing and the motor assembly are removable from the ultra-high vacuum chamber via the access panel.

12. The apparatus of claim 1, wherein the lifting device is connected to the optical component by a vibration isolator.

* * * * *